United States Patent [19]

Mine et al.

[11] Patent Number: 5,370,903
[45] Date of Patent: Dec. 6, 1994

[54] METHOD FOR THE FORMATION OF A SILICON OXIDE FILM

[75] Inventors: Katsutoshi Mine; Takashi Nakamura; Motoshi Sasaki, all of Chiba, Japan

[73] Assignee: Dow Corning Toray Silicon Co., Ltd., Tokyo, Japan

[21] Appl. No.: 146,380

[22] Filed: Oct. 29, 1993

[30] Foreign Application Priority Data

Dec. 11, 1992 [JP] Japan ............... 4-353405

[51] Int. Cl.$^5$ ............................................. B05D 5/12
[52] U.S. Cl. ...................... 427/126.2; 427/226; 427/377; 427/387; 427/397.7; 437/235; 437/238
[58] Field of Search .......... 427/226, 228, 377, 379, 427/387, 397.7, 126.2; 437/235, 238

[56] References Cited

U.S. PATENT DOCUMENTS

| | | | |
|---|---|---|---|
| 3,615,272 | 10/1971 | Collins et al. | 23/366 |
| 4,756,977 | 7/1988 | Halaska et al. | 428/704 |
| 5,118,530 | 6/1992 | Henneman et al. | 427/387 X |
| 5,145,723 | 9/1992 | Ballance et al. | 427/387 X |

FOREIGN PATENT DOCUMENTS

| | | |
|---|---|---|
| 560485 | 9/1983 | European Pat. Off. |
| 386969 | 9/1990 | European Pat. Off. |
| 427395 | 5/1991 | European Pat. Off. |
| 60-86017 | 5/1985 | Japan |
| 60-124943 | 7/1985 | Japan |

OTHER PUBLICATIONS

Gentle, 'Oxidation of Hydrogen Silsesquioxane, (HS103/2)n, by Rapid Thermal Processing, Proceedings of the SPIE, vol. 1595, 1992.

H. Adachi et al., "New Spin-On Glass Materials Containing Polyphenyl-Silsesquioxane", Extended Abstracts, vol. 86-2, p. 858, no date.

V. Belot et al., 'Thermal Decomposition of Hydrosilsesquioxane Gels Under Agron', Eur. Materials Research Soc. Monographs, vol. 5, 77-84, no date.

*Primary Examiner*—Michael Lusignan
*Attorney, Agent, or Firm*—Roger E. Gobrogge

[57] ABSTRACT

Disclosed is a method for the formation of a thick silicon oxide film on the surface of a substrate. The method comprises forming a hydrogen silsesquioxane resin film on the surface of a substrate followed by converting the hydrogen silsesquioxane resin into silicon oxide ceramic by heating the resin film-bearing substrate in a mixed gas atmosphere of above 0 volume % up to 20 volume % oxygen and 80 volume % up to, but not including, 100 vol % inert gas until the content of silicon-bonded hydrogen in the silicon oxide product has reached $\leq 80\%$ of the content of silicon-bonded hydrogen in the hydrogen silsesquioxane resin.

10 Claims, No Drawings

METHOD FOR THE FORMATION OF A SILICON OXIDE FILM

BACKGROUND OF THE INVENTION

The present invention relates to a method for the formation of a silicon oxide film on the surface of a substrate. More specifically, the present invention relates to a method for the formation of a thick silicon oxide film that is free of cracks and pinholes and that is insoluble in organic solvents.

The formation of a protective film on the surface of a substrate is a technique in general use for its protection. In the particular ease of the electric/electronic industries, there has been a very substantial increase in the complexity of semiconductor devices and in topographical variations on the surface of semiconductor devices in association with recent increases in the degree of integration and layer count of semiconductor devices. An interlevel dielectric layer may be formed on the surface of a semiconductor device in order to planarize the topographical variations on the surface of the device, while a passivation coating can be laid down on the surface of a semiconductor device in order to protect it from mechanical damage, chemical damage, damage due to static, ionic contaminants, nonionic contaminants, radiation damage, and so forth.

Silicon oxide films are typically used for the interlevel dielectric layers and passivation coatings formed on semiconductor device surfaces. Chemical-vapor deposition (CVD) and spin-coating are examples of the methods used to form these silicon oxide films. As examples of methods for the formation of silicon oxide film on a semiconductor device surface by spin-coating, Japanese Patent Application Laid Open [Kokai or Unexamined] Numbers Sho 60-124943 [124,943/1985] and Sho 63-144525 [144,525/1988] propose the formation of a film of hydrogen silsesquioxane resin on the surface of the substrate (e.g., the semiconductor device, etc.) and subsequently heating the resin film-bearing substrate in air in order to form a silicon oxide film.

However, the methods proposed in Japanese Patent Application Laid Open Numbers Sho 60-124943 and Sho 63-144525 for silicon oxide film formation are not able to produce a silicon oxide film thicker than 0.6 micrometers (6,000 angstroms). As a result, these methods cannot completely planarize the topographical variations encountered on the surfaces of semiconductor devices, i.e., topographical variations or height differences in excess of 1.0 micrometers (10,000 angstroms). In addition, when the production of a thick silicon oxide film is attempted by these methods, cracks and pinholes are produced in the silicon oxide film and the reliability of the semiconductor device is drastically reduced.

The inventors conducted extensive research into the cause of the inability of the methods proposed in Japanese Patent Application Laid Open Numbers Sho 60-124943 and Sho 63-144525 to produce thick silicon oxide films. It was discovered that this inability is due to heating in air in order to obtain a 0% content of silicon-bonded hydrogen in the silicon oxide product. On the other hand, it was also discovered that the silicon oxide film could perform well as an interlevel dielectric layer or passivation coating on tile surface of a semiconductor device when the Si-bonded hydrogen content in the silicon oxide film product did not exceed 80% of the Si-bonded hydrogen content in the starting hydrogen silsesquioxane resin. Accordingly, the present invention was achieved as a result of extensive research into a silicon oxide film formation method that would be capable of producing a crack-free and pinhole-free thick silicon oxide film that could function as an interlevel dielectric layer or passivation coating on the surface of a semiconductor device and that would also be able to thoroughly planarize the topographical variations on the surfaces of semiconductor devices.

The present invention takes as its object the introduction of a method for the formation of an organic solvent-insoluble, crack-free and pinhole-free silicon oxide thick film by the formation of a hydrogen silsesquioxane resin film on the surface of a substrate and then heating this resin film-bearing substrate.

SUMMARY OF THE INVENTION

The present invention relates to a method for the formation of a silicon oxide film. The method is characterized by the formation of a hydrogen silsesquioxane resin film on the surface of a substrate and subsequent conversion of said hydrogen silsesquioxane resin into silicon oxide ceramic by healing the resin film-bearing substrate in a mixed gas atmosphere of 0 volume % to 20 volume % oxygen (not including 0 volume %) and 80 volume % to 100 volume % inert gas (not including 100 volume %) until the content of silicon-bonded hydrogen in the silicon oxide product has reached $\leq 80\%$ of the content of silicon-bonded hydrogen in the aforesaid hydrogen silsesquioxane resin.

The present invention also relates to a method for the formation of a silicon oxide film on the surface of a semiconductor. The method is characterized by the formation of a hydrogen silsesquioxane resin film on the surface of a semiconductor device and subsequent conversion of said hydrogen silsesquioxane resin into silicon oxide ceramic by heating the resin film-bearing semiconductor device in a mixed gas atmosphere of 0 volume % to 20 volume % oxygen (not including 0 volume %) and 80 volume % to 100 volume % inert gas (not including 100 volume %) until the content of silicon-bonded hydrogen in the silicon oxide product has reached $\leq 80\%$ of the content of silicon-bonded hydrogen in the aforesaid hydrogen silsesquioxane resin.

The present invention further relates to a method for the formation of silicon oxide film which is characterized by the planarization of the topographical variations on the surface of a semiconductor device by the formation thereon of a hydrogen silsesquioxane resin film, and subsequent conversion of said hydrogen silsesquioxane resin into silicon oxide ceramic by heating the resin film-bearing semiconductor device in a mixed gas atmosphere of 0 volume % to 20 volume % oxygen (not including 0 volume %) and 80 volume % to 100 volume % inert gas (not including 100 volume %) until the content of silicon-bonded hydrogen in the silicon oxide product has reached $\leq 80\%$ of the content of silicon-bonded hydrogen in the aforesaid hydrogen silsesquioxane resin.

DETAILED DESCRIPTION OF THE INVENTION

The present invention relates to a method for tile formation of silicon oxide films which are thick, free of cracks and pinholes and insoluble in organic solvents. The process involves forming a hydrogen silsesquioxane resin film on the surface of a substrate and heating the hydrogen silsesquioxane resin to convert it into a silicon oxide ceramic.

The hydrogen silsesquioxane resin used by the present invention to coat the substrate surface is a compound with the following formula:

$$HSiO_{3/2})_n$$

wherein n is an integer. Its terminal groups, molecular weight, and structure are not specifically restricted, although molecular weights of approximately 400 to 100,000 are preferred. Its physical properties, such as viscosity, softening point, etc., are also not specifically restricted. In addition, tile content of silicon-bonded hydrogen in tile hydrogen silsesquioxane resin used by the invention is not specifically restricted. This value will vary with the molecular weight and type of terminal groups, and in general the silicon-bonded hydrogen content is 1.5 to 2.5 weight % calculated on the hydrogen silsesquioxane resin.

The specific method for synthesis of the subject hydrogen silsesquioxane is also not restricted. Methods for hydrogen silsesquioxane synthesis are specifically exemplified by the hydrolysis of trichlorosilane using tile crystal water of benzenesulfonic acid or toluenesulfonic acid (U.S. Pat. No. 3,615,272) and by the hydrolysis of trichlorosilane in dilute solution using a small quantity of water (Japanese Patent Application Laid Open Number Sho 60-86017 [86,017/1985]).

The procedure used in the present invention to form the hydrogen silsesquioxane resin film on the surface of the substrate is not specifically restricted. This procedure is specifically exemplified by the following two methods: (1) preparation of an organic solvent solution of the hydrogen silsesquioxane resin, application of this solution by spin-coating, spraying, or immersion, then removal of the solvent to yield a film of the hydrogen silsesquioxane resin on the surface of the substrate; (2) heating a low-molecular-weight hydrogen silsesquioxane resin at reduced pressure in order to bring about vapor deposition of the resin on the surface of the substrate. The former method is preferred.

There is no specific restriction on the organic solvent used in the former method in order to dissolve the hydrogen silsesquioxane resin. The structure of this organic solvent preferably does not contain active hydrogen. The organic solvent under consideration is specifically exemplified by aromatic solvents such as toluene, xylene, and so forth; aliphatic solvents such as hexane, heptane, octane, and so forth; ketone solvents such as methyl ethyl ketone, methyl isobulyl ketone, and so forth; and ester solvents such as butyl acetate, isoamyl acetate, and so forth. Additional examples of this solvent are silicone solvents, for example, linear siloxanes such as 1,1,1,3,3,3-hexamethyldisiloxane, 1,1,3,3-tetramethyldisiloxane, and so forth; cyclic siloxanes such as 1,1,3,3,5,5,7,7-octamethyltetracyclosiloxane, 1,3,5,7-tetramethyltetracyclosiloxane, and so forth; and silanes such as tetramethylsilane, dimethyldiethylsilane, and so forth. Mixtures of two or more of these organic solvents can also be used.

No specific restrictions apply to the substrates operable in the present invention for formation of the hydrogen silsesquioxane resin film. The substrate is specifically exemplified by glass substrates, ceramic substrates, metal substrates, and semiconductor devices, with semiconductor devices being particularly preferred. The surface of the semiconductor device may present topographical variations, in which event the surface of the semiconductor device can be planarized by the silicon oxide film formation method of the present invention.

The substrate bearing the hydrogen silsesquioxane resin film is subsequently heated in a mixed gas atmosphere of 0 volume % to 20 volume % oxygen (not including 0 volume %) and 80 volume % to 100 volume % inert gas (not including 100 volume %) until the content of silicon-bonded hydrogen in the produced silicon oxide becomes ≦80% of the content of silicon-bonded hydrogen in said hydrogen silsesquioxane resin.

No specific restriction applies to the inert gas useable in the present invention, and this inert gas is specifically exemplified by nitrogen gas, argon gas, helium gas, and neon gas. Nitrogen is preferred for its low cost and ease of acquisition on an industrial basis. The oxygen concentration in the present invention is to be 0 volume % to 20 volume % (excluding 0 volume %) and is preferably 1 volume % to 19 volume %. When the oxygen concentration exceeds 20 volume %, i.e., when the inert gas concentration falls below 80 volume %, cracks and pinholes are produced in the silicon oxide film due to an abrupt and significant onset of oxidation of the hydrogen silsesquioxane resin.

No specific restrictions apply to the heating temperature for the substrate carrying the hydrogen silsesquioxane resin film except that a temperature must be used that can bring the content of silicon-bonded hydrogen in the silicon oxide film product to ≦80% of tile content of silicon-bonded hydrogen in the hydrogen silsesquioxane resin. This heating temperature is, for example, preferably at least 250° C. and more preferably falls in the range of 250° C. to 500° C. When the heating temperature is below 250° C., the hydrogen silsesquioxane resin is not thoroughly converted into ceramic silicon oxide and as a result remains soluble in organic solvent. The product in this case is therefore unfit for use as a passivation coating or interlevel dielectric layer. No specific restrictions apply to the heating time as long as heating is carried out for a period of time sufficient for the content of silicon-bonded hydrogen in the silicon oxide product to become ≦80% of the content of silicon-bonded hydrogen in the starting hydrogen silsesquioxane resin. Heating times that bring this parameter into the range of 15 % to 80% are preferred. When the content of silicon-bonded hydrogen in the produced silicon oxide exceeds 80% of the content of silicon-bonded hydrogen in the starting hydrogen silsesquioxane resin, the silicon oxide product remains soluble in organic solvent and is therefore not capable of functioning as a passivation coating or interlevel dielectric layer.

An infrared spectrophotometer can be used to measure the silicon-bonded hydrogen content in both the hydrogen silsesquioxane resin film and silicon oxide film formed on the surface of the substrate. The point at which the silicon-bonded hydrogen content in the silicon oxide film reaches ≦80% of the silicon-bonded hydrogen content in the starting hydrogen silsesquioxane resin film is readily determined in the present invention using an infrared spectrophotometer from the intensity ratio K'/K wherein K is the intensity of the SiH peak (vicinity of 2250 cm$^{-1}$) relative to the SiOSi peak (vicinity of 1100 cm$^{-1}$) in the hydrogen silsesquioxane resin film and K' is the intensity of the SiH peak (vicinity of 2250 cm$^{-1}$) relative to the SiOSi peak (vicinity of 1100 cm$^{-1}$) in the silicon oxide that is produced.

The silicon oxide film formation method of the present invention can produce a thick (greater than 0.6 micrometers), crack-free, and pinhole-free silicon oxide film that is capable of functioning as a passivation coating or interlevel dielectric layer. In particular, this method can produce crack and pinhole-free silicon oxide films with thicknesses greater than 1.0 micrometers. Furthermore, the crosslink density in the silicon oxide film can be freely controlled or adjusted in the method of the present invention. This provides the additional effect of making possible relaxation of the internal stresses in the silicon oxide film that is produced. Moreover, because the method of the present invention can produce a silicon oxide film at relatively low heating temperatures, it is useful for the formation of an interlevel dielectric layer or passivation coating on a semiconductor device surface because it avoids the melting-based deterioration of the aluminum that is used for semiconductor device interconnections.

The method of the present invention is useful for the formation of the interlevel dielectric layer in multilayer semiconductor devices because an organic resin layer, silicon oxide layer, and so forth, can additionally be formed on the surface of a substrate carrying the silicon oxide film formed by the method of the present invention.

The present invention is explained in greater detail below through working and comparison examples. The method described below was used to measure the value of the silicon-bonded hydrogen content in the silicon oxide film relative to the silicon-bonded hydrogen content in the hydrogen silsesquioxane resin film formed on the surface of the semiconductor device:

Using an infrared spectrophotometer, the intensity $I_{SiOSi}$ of the SiOSi peak (vicinity of 1100 cm$^{-1}$) and the intensity $I_{SiH}$ of the SiH peak (vicinity of 2250 cm$^{-1}$) were determined for the hydrogen silsesquioxane resin film formed on the semiconductor device surface, and their ratio K was calculated from $K = I_{SiH}/I_{SiOSi}$. The intensity $I'_{SiOSi}$ of the SiOSi peak (vicinity of 1100 cm$^{-1}$) and the intensity $I'_{SiH}$ of the SiH peak (vicinity of 2250 cm$^{-1}$) were also determined for the silicon oxide film subsequently formed on the semiconductor device surface, and their ratio K' was calculated from $K' = I'_{SiH}/I'_{SiOSi}$. The ratio K'/K was then calculated.

REFERENCE EXAMPLE 1

Hydrogen silsesquioxane resin was prepared by the method taught in Japanese Patent Publication Number Sho 47-31838 [31,838/1972] as follows:

Toluenesulfonic acid monohydrate was prepared by dripping 6 moles toluene over a period of 1 hour into a mixture of 3.75 moles sulfuric acid and 2.25 moles fuming sulfuric acid at a mixture temperature of 45° C. to 60° C. and then ageing for an additional 30 minutes at 45° C. Into this product was then dripped the mixture of 1 mole trichlorosilane and 6.6 moles toluene over a period of 5 hours at 30° C. followed by ageing for 30 minutes at 45° C. After cooling and layer separation, the toluenesulfonic acid layer (lower layer) was removed. In order to remove the acid present in the upper layer, it was washed with suitable quantities of sulfuric acid/water (50/50 weight ratio), then sulfuric acid/water (25/75 weight ratio), and finally water. The water was then completely eliminated by azeotropic drying for 1 hour to afford a toluene solution. Removal of the toluene from this toluene solution by reduced pressure (vacuum pump) at 60° C. gave hydrogen silsesquioxane resin A. This hydrogen silsesquioxane resin A had a number-average molecular weight ($M_n$) of 1,650, and the value of its weight-average molecular weight/number-average molecular weight ratio ($M_w/M_n$) was 19.4.

20 g hydrogen silsesquioxane resin A was then placed in a thoroughly dried 1 L roundbottom flask made of high-quality glass. 80 g thoroughly dried toluene was added and a thorough dissolution was effected. The entire system was maintained at 25° C., and the interior of the system was purged with nitrogen at a rate that did not remove solvent from the system. This purging was continued until the completion of fractionation. While vigorously stirring the solution, 50 g thoroughly dried acetonitrile was dripped in over a period of 1 hour. The precipitate was eliminated after quiescence for approximately 12 hours. After elimination of the precipitate, another 200 g thoroughly dried acetonitrile was dripped into the solution over a period of 4 hours. Collection of the resulting precipitate and removal of the residual solvent therefrom by vacuum drying at ambient temperature yielded a hydrogen silsesquioxane resin B. The $M_n$ of this hydrogen silsesquioxane resin B was 11,400 and its $M_w/M_n$ was 2.88. The ionic and metal impurities were each $\leq 1$ ppm.

EXAMPLE 1

Hydrogen silsesquioxane resin B was dissolved in methyl isobutyl ketone (MIBK) to prepare a 30 weight % solution. This solution was spin-coated or a substrate for semiconductor device fabrication (height variation = 1.0 micrometers) to give a hydrogen silsesquioxane resin film having a maximum thickness of 1.25 micrometers. After this film formation step, the semiconductor device substrate was held for 20 hours in a pure nitrogen atmosphere and then heated for 2 hours at 400° C. in a mixed gas with a composition of 5 volume % pure oxygen and 95 volume % pure nitrogen. The gas component proportions in this mixed gas were precisely controlled using a mass flow controller. This was followed by gradual cooling of the semiconductor device substrate to room temperature in a pure nitrogen atmosphere. Evaluation of the properties of the silicon oxide film formed on the substrate determined that the maximum thickness was 1.10 micrometers and the topographical variations of a semiconductor device surface were planarized to uniformity. It was confirmed at the same time that there were no pinholes or cracks in the silicon oxide film. Based on the results of infrared spectrophotometric analysis, the silicon-bonded hydrogen content in the silicon oxide film was 31% of the silicon-bonded hydrogen content in the hydrogen silsesquioxane resin film prior to heating. It was also confirmed that the obtained silicon oxide film was insoluble in organic solvents such as MIBK and so forth.

EXAMPLE 2

Hydrogen silsesquioxane resin B was dissolved in MIBK to prepare a 30 weight % solution. This solution was spin-coated on a substrate for semiconductor device fabrication (height variation = 1.0 micrometers) to give a hydrogen silsesquioxane resin film having a maximum thickness of 1.15 micrometers. After this film formation step, the semiconductor device substrate was held for 20 hours in a pure nitrogen atmosphere and then heated for 2 hours at 400° C. in a mixed gas with a composition of 15 volume % pure oxygen and 85 volume % pure nitrogen. The gas component proportions in this mixed gas were precisely controlled using a mass flow controller. This was followed by gradual cooling of the semiconductor device substrate to room temperature in a pure nitrogen atmosphere. Evaluation of the properties of the silicon oxide film formed on the substrate determined that the maximum thickness was 1.02 micrometers and the topographical variations of a semiconductor device surface were planarized to uniformity. It was confirmed at the same time that there were no pinholes or cracks in the silicon oxide film. Based on the results of infrared spectrophotometric analysis, the silicon-bonded hydrogen content in the silicon oxide film was 17% of the silicon-bonded hydrogen content in the hydrogen silsesquioxane resin film prior to heating. It was also confirmed that this silicon oxide film was insoluble in organic solvents such as MIBK and so forth.

COMPARISON EXAMPLE 1

Hydrogen silsesquioxane resin B was dissolved in MIBK to prepare a 30 weight % solution. This solution was spin-coated on a substrate for semiconductor device fabrication (height variation=1.0 micrometers) to give a hydrogen silsesquioxane resin film having a maximum thickness of 1.15 micrometers. After this film formation step, the semiconductor device substrate was held for 20 hours in a pure nitrogen atmosphere and then heated for 2 hours at 400° C. in a mixed gas that at 21 volume % pure oxygen and 79 volume % pure nitrogen had almost the same component proportions as air. The gas component proportions in this mixed gas were precisely controlled using a mass flow controller. The semiconductor device substrate was then gradually cooled to room temperature in a pure nitrogen atmosphere. When the properties of the silicon oxide film formed on the substrate were evaluated, it was found that the maximum thickness was 0.98 micrometers, but also that cracks had been produced in the surface of the silicon oxide film and the topographical variations of a semiconductor device surface were not able to be planarized to uniformity. Based on the results of infrared spectrophotometric analysis, the silicon-bonded hydrogen content in the silicon oxide film was 15% of the silicon-bonded hydrogen content in the hydrogen silsesquioxane resin film prior to heating.

COMPARISON EXAMPLE 2

Hydrogen silsesquioxane resin B was dissolved in MIBK to prepare a 30 weight % solution. This solution was spin-coated on a substrate for semiconductor device fabrication (height variation=0.8 micrometers) to give a hydrogen silsesquioxane resin film having a maximum thickness of 1.26 micrometers. After this film formation step, the semiconductor device substrate was held for 20 hours in a pure nitrogen atmosphere and then heated in a pure nitrogen atmosphere from room temperature to 400° C. over a period of 45 minutes. After the temperature of the semiconductor device substrate had reached 400° C., the atmosphere was quickly changed to pure oxygen and heating was subsequently carried out for 2 hours at 400° C. This was followed by cooling of the semiconductor device substrate to room temperature in a pure nitrogen atmosphere. When the properties of the silicon oxide film formed on the substrate were evaluated, it was found that the maximum thickness was 0.83 micrometers, but also that a large number of cracks had been produced in the surface of the silicon oxide film and the topographical variations of a semiconductor device surface were not able to be planarized to uniformity. Based on the results of infrared spectrophotometric analysis, the silicon-bonded hydrogen content in the silicon oxide film was 12% of the silicon-bonded hydrogen content in the hydrogen silsesquioxane resin film prior to heating.

That which is claimed is:

1. A method for the formation of a silicon oxide film comprising:
   forming a hydrogen silsesquioxane resin film on the surface of a substrate; and
   converting the hydrogen silsesquioxane resin into a silicon oxide ceramic by heating the resin film-bearing substrate in a mixed gas atmosphere of above 0 volume % up to 20 volume % oxygen and 80 volume % up to, but not including, 100 volume % inert gas until the content of silicon-bonded hydrogen in the silicon oxide product has reached $\leq 80\%$ of the content of silicon-bonded hydrogen in the hydrogen silsesquioxane resin.

2. The method of claim 1 wherein the hydrogen silsesquioxane resin film is formed on the surface of the substrate by preparing an organic solvent solution of the hydrogen silsesquioxane resin, applying this solution by a method selected from the group consisting of spin-coating, spraying, and immersion, and removing the solvent.

3. The method of claim 2 wherein the solvent is selected from the group consisting of aromatic solvents, aliphatic solvents, ketone solvents, ester solvents, and silicone solvents.

4. The method of claim 1 wherein the substrate is selected from the group consisting of glass substrates, ceramic substrates, metal substrates, and semiconductor devices.

5. The method of claim 1 wherein the inert gas is selected from the group consisting of nitrogen gas, argon gas, helium gas, and neon gas.

6. The method of claim 1 wherein the oxygen content is between 1 volume % and 19 volume %.

7. The method of claim 1 wherein the heating temperature is in the range of 250° C. to 500° C.

8. The method of claim 1 wherein the heat time is sufficient to lower the content of silicon-bonded hydrogen in the silicon oxide product to 15–80% of the content of silicon-bonded hydrogen in the hydrogen silsesquioxane resin.

9. A method for the formation of a silicon oxide film wherein said method is characterized by the formation of a hydrogen silsesquioxane resin film on the surface of a semiconductor device and subsequent conversion of said hydrogen silsesquioxane resin into silicon oxide ceramic by heating the resin film-bearing semiconductor device in a mixed gas atmosphere of above 0 volume % up to 20 volume % oxygen and 80 volume % up to, but not including, 100 volume % inert gas until the content of silicon-bonded hydrogen in the silicon oxide product has reached $\leq 80\%$ of the content of silicon-bonded hydrogen in tile hydrogen silsesquioxane resin.

10. A method for the formation of a silicon oxide film wherein said method is characterized by
   the planarization of the topographical variations on the surface of a semiconductor device by the formation thereon of a hydrogen silsesquioxane resin film, and
   subsequent conversion of said hydrogen silsesquioxane resin into silicon oxide ceramic by heating the resin film-bearing semiconductor device in a mixed gas atmosphere of above 0 volume % up to 20 volume % oxygen and 80 volume % up to, but not including, 100 volume % inert gas until the content of silicon-bonded hydrogen in the silicon oxide product has reached $\leq 80\%$ of the content of silicon-bonded hydrogen in the hydrogen silsesquioxane resin.

* * * * *

UNITED STATES PATENT AND TRADEMARK OFFICE
CERTIFICATE OF CORRECTION

PATENT NO. : 5,370,903
DATED : December 6, 1994
INVENTOR(S) : Katsutoshi Mine, Takashi Nakamura, and Motoshi Sasaki It is certified that error appears in the above-identified patent and that said Letters Patent are hereby corrected as shown below:

At column 1, line 64 delete "tile" and insert therefore --the--.
At column 2, line 64 delete "tile" and insert therefore -- the--.
At column 3, lines 13, 14, and 23 delete "tile" and insert therefore --the--.
At column 4, line 29 delete "tile" and insert therefore --the--.
In claim 9, last line, delete "tile" and insert therefore --the--.

Signed and Sealed this

Twenty-first Day of October 1997

Attest:

BRUCE LEHMAN

Attesting Officer

Commissioner of Patents and Trademarks